United States Patent
Kumada et al.

(10) Patent No.: US 6,453,455 B1
(45) Date of Patent: Sep. 17, 2002

(54) AUTOMATIC WIRING DESIGN APPARATUS AND AUTOMATIC WIRING DESIGN METHOD

(75) Inventors: Tohru Kumada; Yukihiko Onishi, both of Oyama; Eiichi Konno; Takao Yamaguchi, both of Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/460,916

(22) Filed: Dec. 14, 1999

(30) Foreign Application Priority Data

Dec. 15, 1998 (JP) .......................................... 10-355482

(51) Int. Cl.[7] .............................................. G06F 17/50
(52) U.S. Cl. ............................ 716/13; 716/12; 716/14; 716/15; 716/16
(58) Field of Search ........................ 716/1–18; 438/129, 438/599, 613, 666; 257/503, 738, 773

(56) References Cited

U.S. PATENT DOCUMENTS 4,823,276 A * 4/1989 Hiwatashi .................... 716/14
6,245,599 B1 * 6/2001 Goto et al. ................. 438/129

FOREIGN PATENT DOCUMENTS

| JP | 8-30671 | 2/1996 |
| JP | 9-223742 | 8/1997 |
| JP | 10-27194 | 1/1998 |
| JP | 10-63697 | 3/1998 |

* cited by examiner

Primary Examiner—Matthew Smith
Assistant Examiner—Naum Levin
(74) Attorney, Agent, or Firm—Katten Muchin Zavis Rosenman

(57) ABSTRACT

There is provided an automatic wiring design apparatus comprising a designating unit for designating a line segment which is movable element; a specifying unit for specifying a first element whereat a first space between the first element and the line segment is smaller than a first distance; and a determining unit for determining a first position of the line segment to be shifted so that the first space satisfies the first distance. Therefore, if a barrier element specified by designating a line segment is an immovable element, the self-avoidance process by which the designated line segment can be moved is performed, so that the occurrence of a design-standard error can be avoided. The determining unit establishes the line segment as a been element, establishes the first element as a new element, and performs a pushing process for determining a position of the been element to be shifted relative to the new element to determine the first position of the line segment. By performing a swapping process for switching a designated line segment and the barrier element which has been, the self-avoidance process can be easily performed by employing the conventional pushing process.

14 Claims, 7 Drawing Sheets

FIG. 2A   FIG. 2B   FIG. 2C
FIG. 2D   FIG. 2E   FIG. 2F
FIG. 2G   FIG. 2H   FIG. 2I

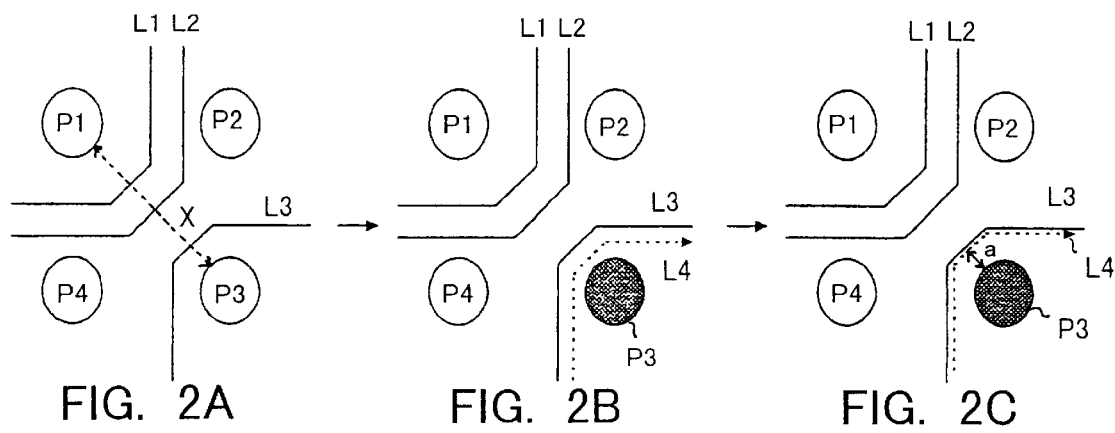
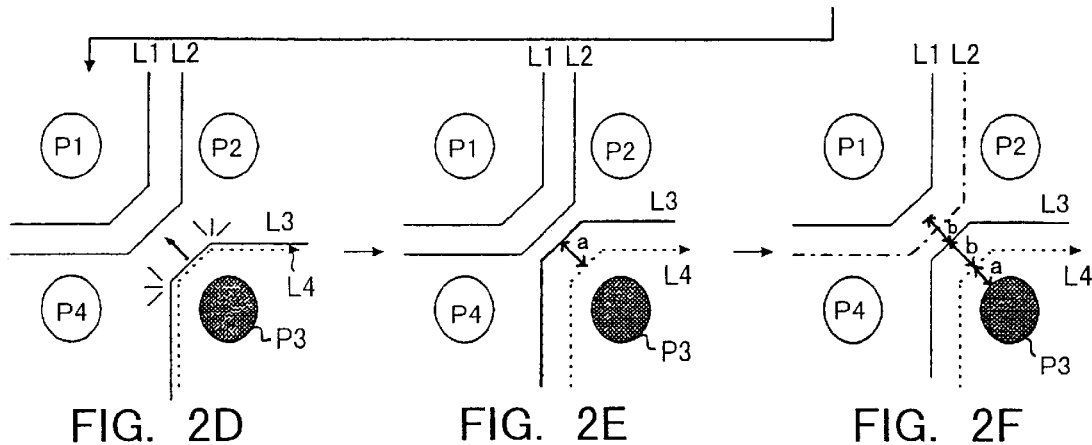
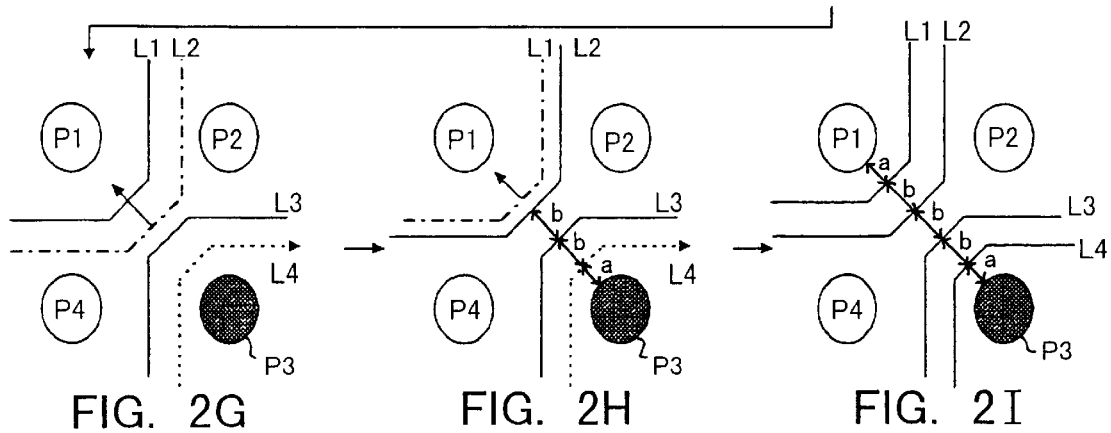
FIG. 2A  FIG. 2B  FIG. 2C
FIG. 2D  FIG. 2E  FIG. 2F
FIG. 2G  FIG. 2H  FIG. 2I

AUTOMATIC WIRING DESIGN APPARATUS AND AUTOMATIC WIRING DESIGN METHOD

BACKGROUND OF THE INVENTION

1. Field of the Invention

The present invention relates to an automatic wiring design apparatus, and to an automatic wiring design method for a substrate on which multiple electronic parts, such as an LSI, are mounted.

2. Related Arts

A super-compact electronic device, such as a portable telephone, incorporates an electric substrate on which multiple electronic parts, such as an LSI, are mounted. These electronic parts are mounted close together, at a high density, in order to utilize the limited available substrate area as effectively as possible. When designing the wiring pattern for such a substrate, the electronic parts are mounted as close together as possible, but so that the spaces between the electronic parts and the spaces between lines for wiring are not smaller than a predetermined reference value.

FIGS. 9A and 9B are diagrams for explaining the wiring design processing for a conventional automatic wiring design apparatus. FIG. 9A is a diagram showing an example where a line segment A, as designated by a designer, is located as shown at a position close to a line segment B. If the space between the line segments A and B is smaller than a predetermined reference distance 11, the line segment B is designated a barrier element. Then, the line segment B, which has been, is automatically shifted to the position occupied by a line segment B' (indicated by a broken line) so that the reference distance 11 is satisfied. The process by which the line segment designated by the designer is regarded as the valid location, and the other line segment, which has been, is shifted to satisfy the predetermined reference distance 11 is called a "pushing process." Therefore, in the wiring design process, even if a space for a line segment is designated that is smaller than the reference distance 11, the reference distance 11 is automatically satisfied by regarding the line segment as a movable element and by performing the pushing process.

FIG. 9B is a diagram showing an example where a position designated by a designer for line segment A is located as shown near a pin position C of an LSI. If the space between the line segment A and the pin C is smaller than a reference distance 12, the pin C is specified as a barrier element. However, in this case, the above pushing process is not performed because the pin C is regarded as an immovable element. If the pin C, as well as the line segment, is regarded as a movable element and the pushing process is performed to shift the position of the pin C, the LSI is shifted as a whole, and accordingly, the wiring pattern of a substrate may be destroyed. Therefore, when the barrier element is an immovable element, the designation of the line segment is regarded as invalid, and the designer must repeat the designation of the line segment.

As is described above, since the pushing process is performed only when the barrier element is a movable element and is not performed when it is an immovable element, deterioration of the design efficiency occurs.

SUMMARY OF THE INVENTION

It is, therefore, one objective of the present invention to provide an automatic wiring design apparatus, and an automatic wiring design method which together can automatically design a wiring pattern that satisfies a predetermined reference distance, regardless of whether a barrier element, which is specified by the designation of a line segment, is a movable element or an immovable element.

To achieve the above objective, the present invention provides an automatic wiring design apparatus comprising:
 a designating unit for designating a line segment which is movable element;
 a specifying unit for specifying a first element whereat a first space between the first element and the line segment is smaller than a first distance; and
 a determining unit for determining a first position of the line segment to be shifted so that the first space satisfies the first distance.

As a result, if a barrier element specified by designating a line segment is an immovable element, the self-avoidance process by which the designated line segment can be moved is performed, so that the occurrence of a design-standard error can be avoided.

For example, the determining unit establishes the line segment as a been element, establishes the first element as a new element, and performs a pushing process for determining a position of the been element to be shifted relative to the new element to determine the first position of the line segment. By performing a swapping process for switching a designated line segment and the barrier element which has been, the self-avoidance process can be easily performed by employing the conventional pushing process.

Further in case that a second space between a second element including the line segment and a third element is smaller than a second distance by shifting the line segment to the first position, the determining unit determines a second position of the third element to be shifted so that the second space satisfies the second distance.

The automatic wiring design apparatus of the present invention further comprises a complexity determining unit for comparing a level of change in the complexity of a wiring pattern before and after shifting of the line segment and the third element with a predetermined reference level. And in case that the level of change is equal to or less than the predetermined reference level, the complexity determining unit validates the designation of the line segment, and in case that the level of change is greater than the predetermined reference level, the complexity determining unit invalidates the designation of the line segment.

Preferably, the complexity of the wiring pattern is determined by the total number of bends in the line segments which constitute the wiring pattern, and/or by the lengths of the line segments. Since the complexity of the wiring pattern can be determined, the wiring pattern can be prevented from becoming too complicated when a design-standard error is resolved.

Furthermore, to achieve the above objective, the present invention provides an automatic wiring design method comprising the steps of:
 designating a line segment which is movable element;
 specifying a first element whereat a first space between the first element and the line segment is smaller than a first distance; and
 determining a first position of the line segment to be shifted so that the first space satisfies the first distance.

For example, in the determination step, the line segment is established as a been element, the first element is established as a new element, and a pushing process for determining a position of the been element to be shifted relative to the new element is performed to determine the first position of the line segment.

BRIEF DESCRIPTION OF THE DRAWINGS

FIGS. 2A to 2I are diagrams for explaining an automatic wiring design process according to the embodiment of the present invention;

DETAILED DESCRIPTION OF THE PREFERRED EMBODIMENT

The preferred embodiment of the present invention will now be described while referring to the accompanying drawings. It should be noted, however, that the technical scope of the present invention is not limited to this embodiment.

Figure 1:
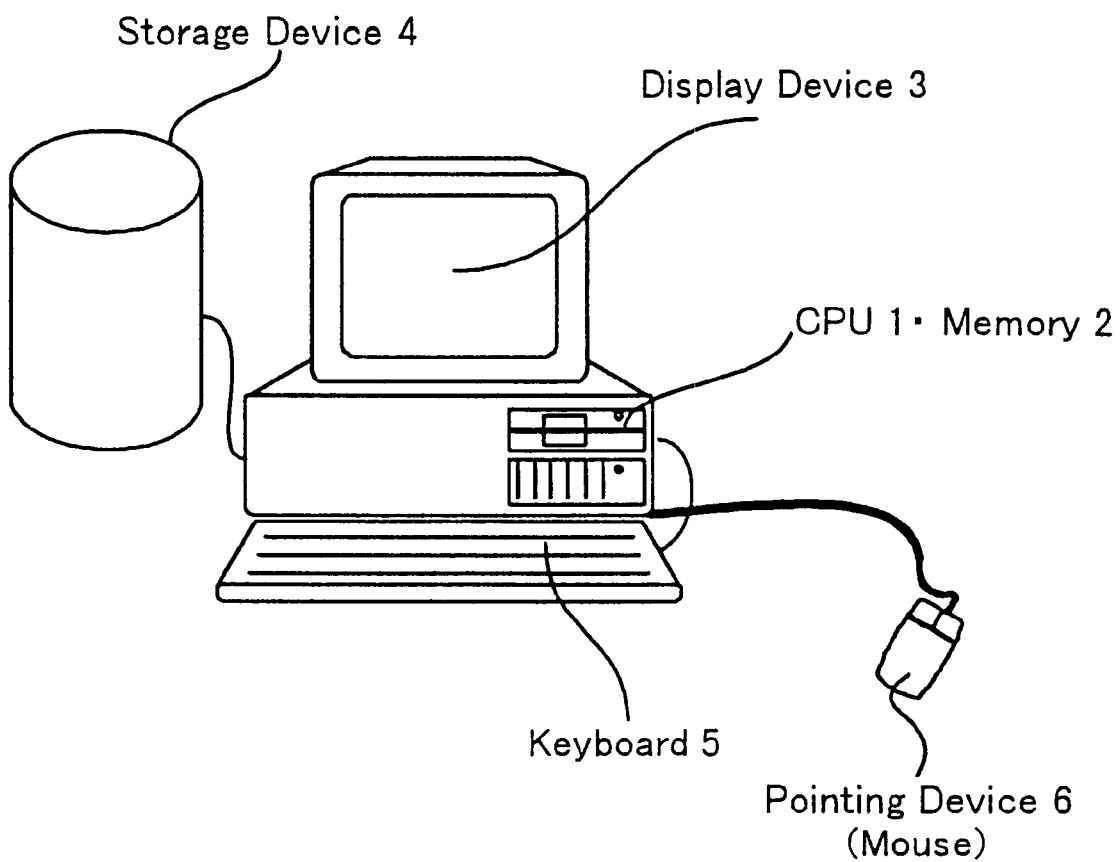
FIG. 1 is a diagram illustrating the arrangement of an automatic wiring design apparatus according to one embodiment of the present invention.

FIG. 1 is a diagram illustrating the arrangement of an automatic wiring design apparatus according to one embodiment of the present invention. As is shown in FIG. 1, the automatic wiring design apparatus is a computer system, such as a workstation, which comprises a CPU 1, a memory 2, a display device 3, a storage device 4, a keyboard 5, and a pointing device (mouse) 6. A data file for a design pattern, a program for executing an automatic wiring design process, which is the feature of the present invention, and a wiring pattern complexity determination standard library, which will be described later, are stored in the storage device 4.

When this computer system is activated, the program and the pattern data are loaded into the memory 2. Then, when a designer designates a new line segment while monitoring the screen of the display device 3, the CPU 1 executes the automatic wiring design process, which will be described later.

FIGS. 2A to 2I are diagrams for explaining the automatic wiring design process for this embodiment. In FIG. 2A, three line segments L1, L2 and L3 are located adjacent to electronic pins P1, P2, P3 and P4 of a BGA (Ball Grid Array) type. As is described above, for the line design a pin P is an immovable element and a line segment L is a movable element.

Assume that a reference distance "a" between a pin P and a line segment L, and a reference distance "b" between line segments L are set as design-standard for a space X between the pins P1 and P3. Further, assume that, according to the design-standard, four line segments L can fit in the space X between the pins P1 and P3. That is, although in FIG. 2A there are three line segments L in the space X wherein four line segments L can be placed, according to the standard design one more line segment L can be inserted between the pins P1 and P3.

Thus, as is shown in FIG. 2B, the designer designates an additional line segment L4 (broken line) between the pin P3 and the line segment L3, so that the line segment L4 is near the pin P3. At this time, assume that the space between the line segment L4 and the pin P3 does not satisfy the reference distance "a," which is the design-standard for the pin P3. In other words, the pin P3 constitutes a barrier element.

When the line segments are designated in this manner, conventionally the pushing process can not be performed because relative to the designated line segment the barrier element is a immovable element. As a result, the designation is regarded as invalid, and the designer must designate another line segment.

However, according to this embodiment, first, the position to which the line segment L4 can be shifted, a a position which satisfies the design reference distance "a," is calculated relative to the pin P3, which is the barrier element, and as is shown in FIG. 2C, the line segment L4 is shifted to that position. The activity by which, unlike the conventional pushing process, the designated line segment is moved relative to the barrier element to satisfy the design-standard is hereinafter called "self-avoidance." Although the barrier element is an immovable element, so long as the design-standard is satisfied for the other elements, self-avoidance can be employed to perform automatic wiring design without the line segment being re-designated, as will be described later.

In FIG. 2C, in accordance with the self-avoidance process, since the line segment L4 is moved relative to the pin P3, the design-standard for the pin P3 is satisfied. However, the process also produces, with the line segment L3, a design-standard error (the space between the line segments L3 and L4 is smaller than the reference distance b). Therefore, the line segment L3 is designated a design-standard error element (see FIG. 2D).

In this case, the conventional pushing process is performed. Specifically, calculations are performed to determine to which position the line segment L3, which has been, is to be shifted, and as is shown in FIG. 2E, the line segment L3 is moved to that position so that the design-standard for the line segment L4 is satisfied.

Then, as is shown in FIG. 2F, the design-standard for the line segment L3 and the line segment L4 is satisfied, but the process produces a design-standard error for the line segments L2 and L3 (the space between the line segments L2 and L3 is smaller than the reference distance b). Therefore, the line segment L2 is designated a design-standard error element.

Similarly thereafter, as is shown in FIG. 2G, the conventional pushing process is performed. That is, to satisfy the design-standard the line segment L2 is moved relative to the line segment L3, which has already been.

As a result, as is shown in FIG. 2H, the design-standard for the line segment L2 and the line segment L3 is satisfied, but a design-standard error is produced for the line segments L1 and L2 (the space between the line segments L1 and L2 is smaller than the reference distance b). Thus, the line segment L1 is designated a design-standard error element.

In this case the conventional pushing process is also performed. In other words, to satisfy the design-standard the line segment L1 is moved relative to the line segment L2, which has already been.

FIG. 2I is a diagram showing the wiring pattern after the line segment L1 has been moved. As is described above, according to the design-standard four line segments can be inserted in the space X between the pins P1 and P3. Furthermore, since the line segments L4, L3 and L2 are moved so that they are spaced at the reference distances a and b, the space between the line segment L1 and the pin P1 satisfies the design-reference distance a. That is, since the designated line segment L4 and the line segments L1, L2 and L3, which have been, all satisfy the design-standard, the automatic wiring design process for the designation of the line segment L3 is terminated.

Figure 3:
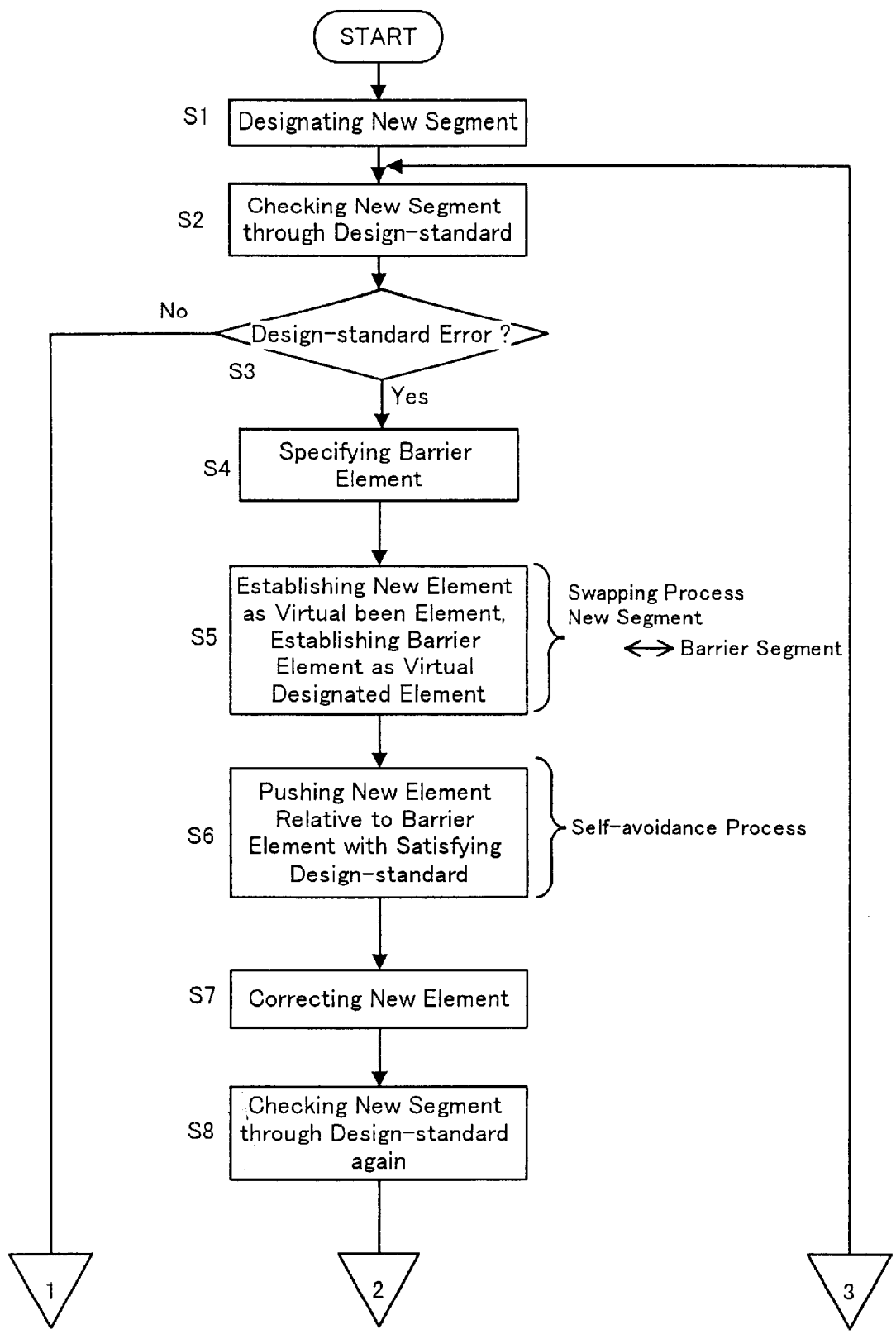
FIG. 3 is a flowchart (1) for the automatic wiring design process according to the embodiment of the present invention.
Figure 4:
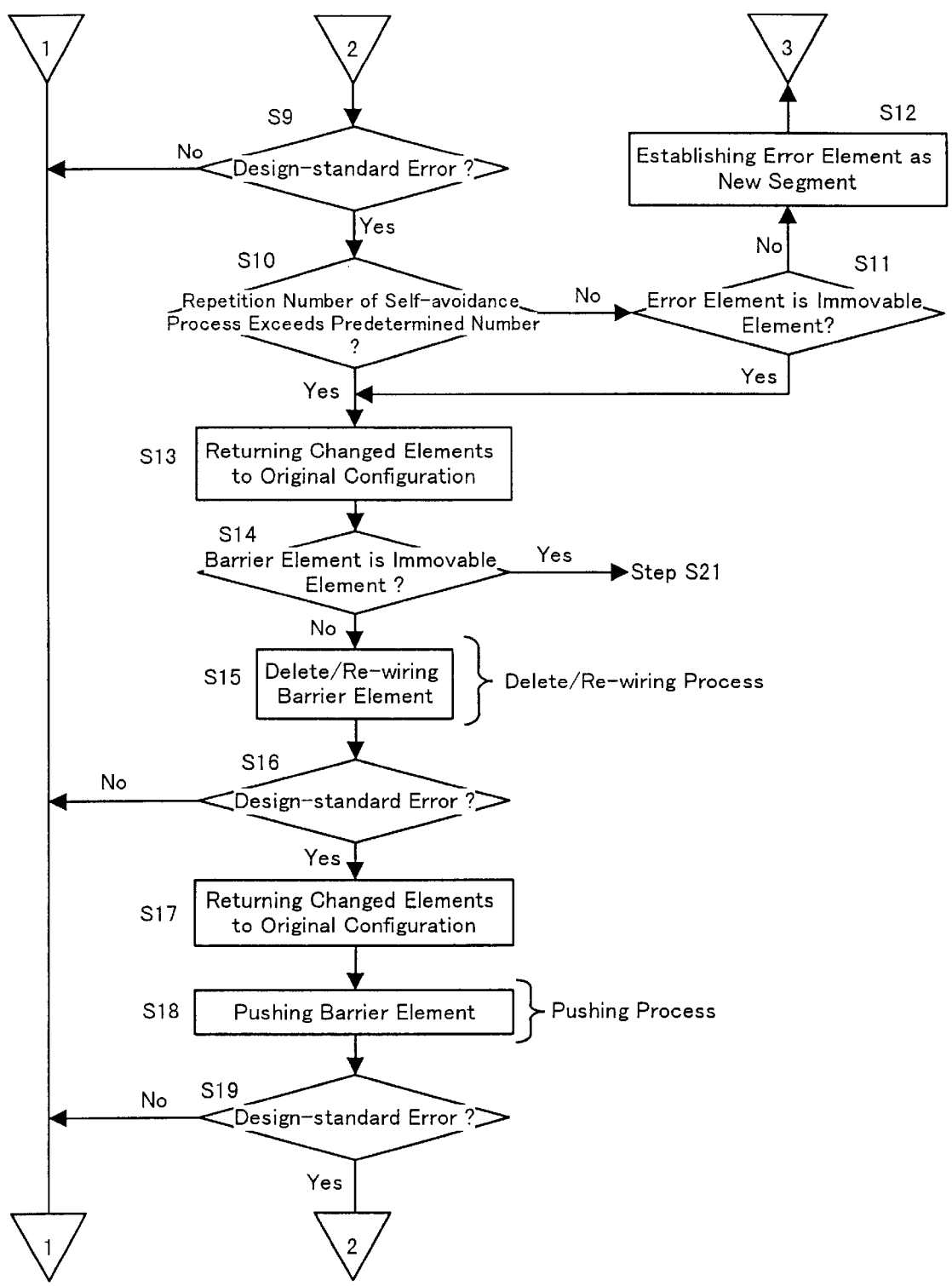
FIG. 4 is a flowchart (2) for the automatic wiring design process according to the embodiment of the present invention.
Figure 5:
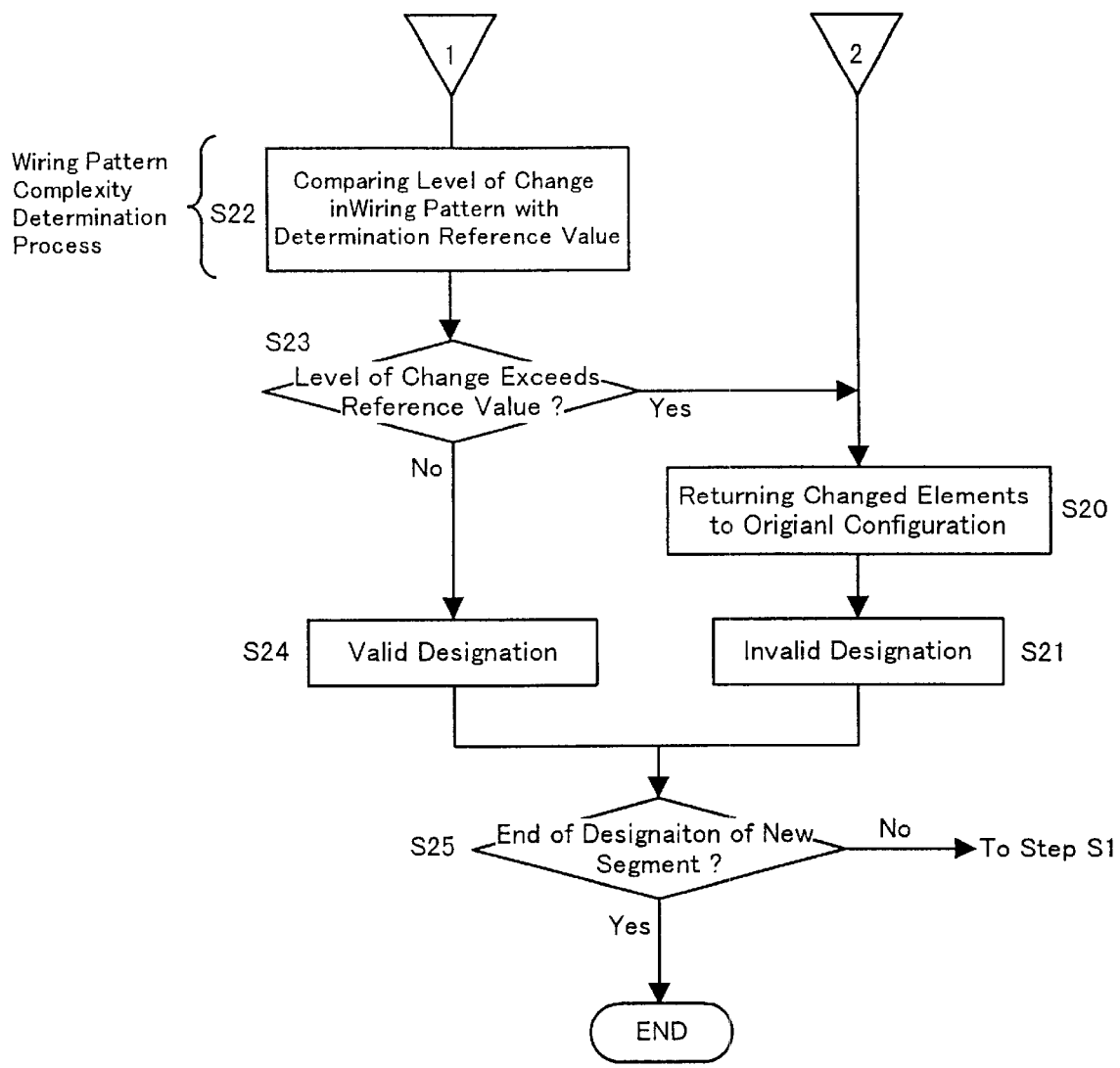
FIG. 5 is a flowchart (3) for the automatic wiring design process according to the embodiment of the present invention.

FIGS. 3 to 5 are flowcharts showing the automatic wiring design process according to the embodiment of the present invention. In the automatic wiring design process, the self-avoidance process is performed as described above, and in this embodiment, the conventional pushing process is employed to perform the self-avoidance process. Specifically, first, at step S1 in FIG. 3, a new line segment (hereinafter referred to as a new segment) is designated. This corresponds, for example, to a condition where, as is shown in FIG. 2B, the line segment L4 is designated between the line segment L3 and the pin P3. At step S2, the design-standard check is performed, i.e., a determination is made as to whether the space between the new segment and peripheral elements, which have been, satisfies the design-standard. If, at step S3, the designation of the new segment produces a design-standard error and the design-standard is not satisfied, at step S4 a barrier element, which is an object of the design-standard error, is specified. For example, when in FIG. 2C the designation of the line segment L4 produced a design-standard error at the pin P3, the pin P3 is specified as a barrier element.

At step S5, the barrier element, which has been, is established as a newly designated element (a virtual designated element), and a newly designated segment is established as a element which has been (a virtual been element). For example, in FIG. 2B, the pin P3 is established as the virtual designated element, and the line segment L4 is established as the virtual been element.

At step S6, the normal pushing process is performed. Therefore, the virtual been element is moved relative to the virtual designated element so that it satisfies the design-standard. For example, in FIG. 2C the line segment L4 is moved relative to the pin P3 to satisfy the design-standard. Thus, actually, the self-avoidance process is performed in which the newly designated segment is moved relative to the barrier element which has been.

Specifically, in the normal pushing process, if a element which has been is specified as a movable barrier element for the line segment designated newly, the been element is moved; however, according to the self-avoidance process of this invention, the newly designated segment is moved while the been element is not moved. In order to perform the self-avoidance process by using the conventional pushing process, at step S5 only the process (swapping process) for changing the designated line segment and the been element must be performed. When the normal pushing process is performed following the swapping process, the self-avoidance process, according to which the designated line segment moves voluntarily, is carried out. As is described above, the self-avoidance process, which uses the conventional pushing process, can be performed by simply adding the swapping process to a design program.

When the pushing process is performed at step S6, a correction process is then performed for a new segment which has been changed in the course of the performance of the pushing process (step S7).

Figure 6A:
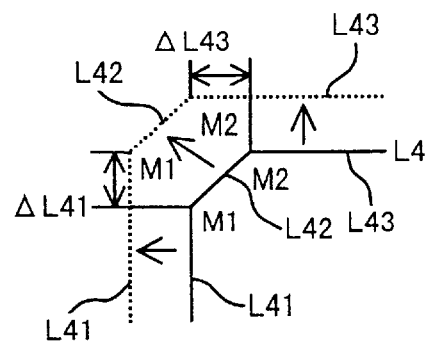
FIGS. 6A and 6B are diagrams for explaining a process for correcting the positioning of a new segment.
Figure 6B:
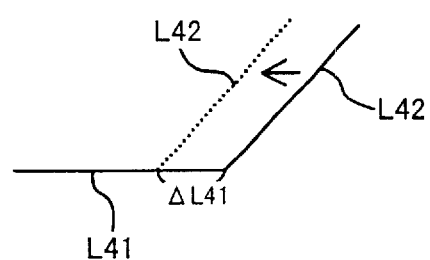

FIGS. 6A and 6B are diagrams for explaining the process for correcting a new segment. First, in FIG. 6A, a line segment L4 is divided into segments L41, L42 and L43 at its bending points M1 and M2. In the correction process, the segments L41 and L43 are extended by distances .L41 and .L43, so that even after the line segment L4 has been moved to the position indicated by a broken line, the segments L41 and L42 are connected at the bending point M1 and the segments L42 and L43 are connected at the bending point M2. In FIG. 6B, as well as in FIG. 6A, the line segment L4 is divided into segments L41 and L42 at its bending point M1. If segment L42 is moved to the position indicated by a broken line, excess portion .L41 is generated for the segment L41. Therefore, the correction process is performed to delete .L41.

Referring again in FIG. 3, at step S8 a check is performed to determine whether, as a result of the self-avoidance process performed at step S7, a new segment satisfies the design-standard relative to the other elements which have been. For example, in FIG. 2D, as a result of the shifting of the line segment L4, the position of the line segment L4 causes a design-standard error relative to the line segment L3.

In FIG. 4, if a design-standard error is present at step S9, at step S10 a check is performed to determine whether a repetition count of the performed self-avoidance process at step S6 exceeds a predetermined number.

The self-avoidance process will repeat unlimitedly as long as the design-standard error occurs, that causes the whole wiring pattern to be complicated, if no limit for the repetition count of the self-avoidance process is set. To prevent the whole wiring pattern from becoming complicated by the unlimited self-avoidance process, the limit of the repetition count is set.

When, at step S10, the repetition count of the performed self-avoidance process is equal to or smaller than the predetermined number, at step S11 a check is performed to determine whether the other element, which is the object of a design-standard error (hereinafter referred to as an error element), is an immovable element. When the error element is a movable element, at step S12 it is designated a newly designated segment. In FIG. 2D, for example, since the line segment L3, which is the error element, is the movable element, it is established as a newly designated segment.

Returning to step S2, the design-standard is examined again for the new segment established at step S12, and the process performed at steps S3 to S8 is repeated. Since, in FIG. 2D, for example, the position of the new segment L3 constitutes a design-standard error because of the presence of the line segment L4, which is the been element, at step S4 the line segment L4 is designated a barrier element. At step S5, therefore, the line segment L4 is specified as the virtual designated element, and the line segment L3 is established as the virtual been element. At step S6, the self-avoidance process is performed so that the new segment L3 is moved relative to line segment L4 and the design-standard is satisfied. However, the self-avoidance process for moving the new segment L3 is the same as the normal pushing process, because the new segment L3, which is originally the been element, is shifted. As for design-standard errors that occur as a chain reaction following the performance of the self-avoidance process for a first designation of the line segment (line segment L4), the line segments L3, L2 and L1, which are error elements, must be shifted sequentially during the normal pushing process. In order to perform the first self-avoidance process and the following pushing process in the same self-avoidance processing loop, at step S12 the error elements L3, L2 and L1, which are the been elements, are inverted to the new segments, and at step S5 they are returned to the been elements. As a result, the pushing process can be performed as the self-avoidance process.

Therefore, the pushing process for the line segments L3, L2 and L1 in FIGS. 2E to 2I is carried out by performing the self-avoidance process at steps S2 to S12.

Referring again to FIG. 4, when at step S10 the self-avoidance process repetition count exceeds the predetermined number, and when at step S11 the error element is an immovable element, the self-avoidance process can not be continued and the process moves to step S13. At step S13, since the design-standard error can not be resolved by the self-avoidance process, elements which have been shifted during the self-avoidance process are returned to their original position. If, at step S14, the barrier element specified at step S4 is not an immovable element, the process explained below is performed. When, at step S14, the barrier element specified at step S4 is an immovable element (e.g., a pin), the designation of a new segment is invalidated (step 321 in FIG. 5).

At step S15, if possible, the deletion/re-wiring process is performed for a line segment which has been designated a barrier element.

Figure 7A:
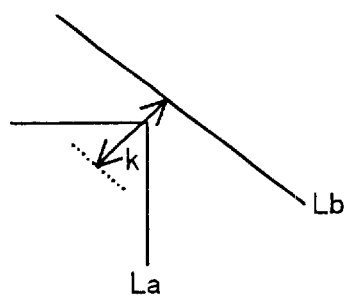
FIGS. 7A and 7B are diagrams for explaining a delete/re-wiring process.
Figure 7B:
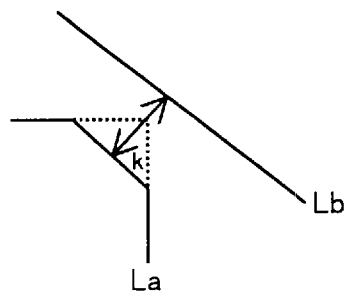

FIGS. 7A and 7B are diagrams for explaining the deletion/re-wiring process. In FIG. 7A, when a new line segment Lb is designated near a right-angle bend in a line segment (a barrier element) La, a design-standard error occurs because a space K between the line segments is smaller than the design-standard. In this case, as is shown in FIG. 7B, part of the right-angle portion is deleted and re-wired to be parallel to the newly designated line segment Lb, at the space K which satisfies the design-standard.

If the design-standard error is not resolved by performing the deletion/re-wiring process at step S16, at step S17 the altered barrier element (the line shape which includes the re-wired portion) La is returned to its original configuration (a right angle).

Then, at step S18 the conventional pushing process is performed for the barrier element. That is, the barrier element is shifted so that the design-standard is satisfied relative to the new segment. If a series of design-standard errors occurs, as in a chain reaction, pushing processes are performed sequentially.

If the design-standard error can not be resolved by the pushing process at step S19, at step S20 in FIG. 5 the elements which were shifted during the pushing process are returned to their original position. Then, at step S21 the designation of the new segment is invalidated.

If the design-standard error is resolved at step S9, S16 or S19, at step S22 in FIG. 5 the wiring pattern complexity determination process is performed.

Figure 8:
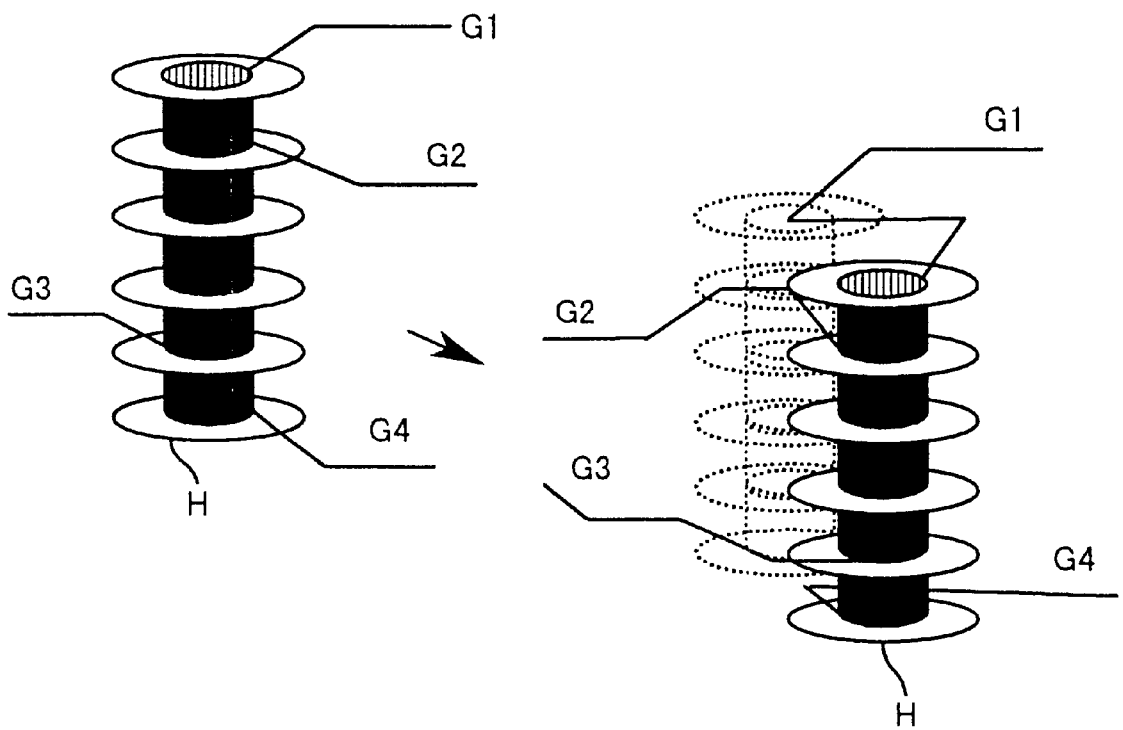
FIG. 8 is a diagram for explaining a wiring pattern complexity determination process.
Figure 9A:
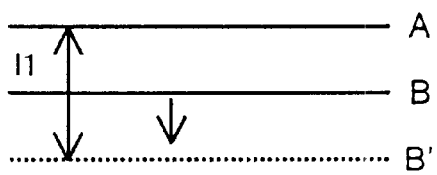
FIGS. 9A and 9B are diagrams for explaining an automatic wiring design process performed by a conventional automatic wiring design apparatus.
Figure 9B:
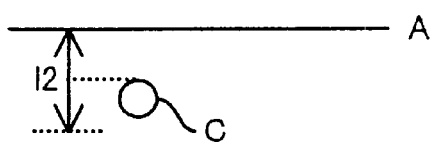

FIG. 8 is a diagram for explaining the wiring pattern complexity determination process. In FIG. 8, a via hole to which a plurality of line segments are connected is employed as a movable element. The via hole is a conductive hole which connects line segments in a plurality of different layers, which constitute a substrate and for each of which a wiring pattern is present. Shown in FIG. 8 is a via hole H having six layers, and mutually connected line segments G1, G2, G3 and G4, which belong to different layers. The via hole H is established as a movable element in the wiring design.

Assume that relative to a specific line segment the via hole H can not maintain a space which satisfies the design-standard, and is moved by the self-avoidance process or the pushing process. Accordingly, the line segments G1, G2, G3 and G4, which are connected to the via hole H, are shifted. The wiring patterns for the line segments G1, G2, G3 and G4 are corrected in order to maintain the connection with the via hole H, and as is shown in FIG. 8, the number of bends in and the length of each line segment are increased, and the wiring patterns are changed (the wiring patterns become complicated).

Therefore, in order to prevent a resultant wiring pattern from becoming excessively complicated, at step S22 a level of change in the wiring pattern is compared with a predetermined determination reference value, which is stored in the wiring pattern complexity determination reference library in the storage device 4. If it is determined at step S23 that the level of change does not exceed the determination reference value, the designation of a new segment is validated (step S24).

Specifically, the level of change in a wiring pattern includes an increase in the number of bends in a line segment and an increase in the length of the line segment. The determination reference value is, for example, a predetermined ratio (e.g., approximately 10 to 20%) relative to the number of bends in and the length of the line segment before the change is effected.

When the level of change exceeds the determination reference value, at step S20 the elements which have been moved during the above process are returned to their original position, and at step S21 the designation of the new segment is invalidated.

When the next line segment is designated at step S25, the process returns to step S1. But if the designation of the line segment is invalidated, the automatic wiring design process performed according to this embodiment is terminated.

As is described above, since the automatic wiring design process, including the self-avoidance process, the deletion/re-wiring process and the pushing process, is performed for the designation of line segments, design-standard errors tend to be avoided more effectively, and the number of line segment designations is reduced.

According to the present invention, even when a barrier element is an immovable element, relative to a designated line segment, the self-avoidance process for voluntarily moving the designated line segment is performed, so that a design-standard error can be avoided. Therefore, the number of line segments to be designated by a designer can be reduced, and the wiring design process can be simplified.

Furthermore, since the swapping process for exchanging a designated line segment and a barrier element which has been is performed, the self-avoidance process can be easily implemented by using the conventional pushing process.

In addition, since the wiring pattern complexity is determined, the wiring pattern can be prevented from becoming excessively complicated when the design-standard error is resolved.

The present invention may be embodied in other specific forms without departing from the spirit or essential characteristics thereof. The present embodiment is therefore to be considered in all respects as illustrative and not restrictive, the scope of the invention being indicated by the appended claims rather than by foregoing description and all change which come within the meaning and range of equivalency of the claims are therefore intended to be embraced therein.

What is claimed is:

1. An automatic wiring design apparatus for designing wiring pattern as satisfying a predetermined design-standard comprising:

a designating unit for designating a line segment which is movable element;

a specifying unit for specifying a first element whereat a first space between said first element and said line segment is smaller than a first distance; and a determining unit for determining a first position of said line segment to be shifted so that said first space satisfies said first distance.

2. The automatic wiring design apparatus according to claim 1, wherein said determining unit establishes said line segment as a been element, establishes said first element as a new element, and performs a pushing process for determining a position of said been element to be shifted relative to said new element to determine said first position of said line segment.

3. The automatic wiring design apparatus according to claim 1, wherein said first element is an immovable element.

4. The automatic wiring design apparatus according to claim 1, wherein, in case that a second space between a second element including said line segment and a third element is smaller than a second distance by shifting said line segment to said first position, said determining unit determines a second position of said third element to be shifted so that said second space satisfies said second distance.

5. The automatic wiring design apparatus according to claim 4, further comprising:

a complexity determining unit for comparing a level of change in the complexity of a wiring pattern before and after shifting of said line segment and said third element with a predetermined reference level, wherein, in case that said level of change is equal to or less than said predetermined reference level, said complexity determining unit validates the designation of said line segment, and in case that said level of change is greater than said predetermined reference level, said complexity determining unit invalidates the designation of said line segment.

6. The automatic wiring design apparatus according to claim 1, further comprising:

a complexity determining unit for comparing a level of change in the complexity of a wiring pattern before and after shifting of said line segment with a predetermined reference level, wherein, in case that said level of change is equal to or less than said predetermined reference level, said complexity determining unit validates the designation of said line segment, and in case that said level of change is greater than said predetermined reference level, said complexity determining unit invalidates the designation of said line segment.

7. The automatic wiring design apparatus according to claim 6, wherein said complexity of said wiring pattern is determined by the total number of bends in the line segments which constitute said wiring pattern, and/or by the lengths of the line segments.

8. An automatic wiring design method for designing wiring pattern as satisfying a predetermined design-standard comprising the steps of:

designating a line segment which is movable element;

specifying a first element whereat a first space between said first element and said line segment is smaller than a first distance; and determining a first position of said line segment to be shifted so that said first space satisfies said first distance.

9. The automatic wiring design method according to claim 8, wherein, in said determination step, said line segment is established as a been element, said first element is established as a new element, and a pushing process for determining a position of said been element to be shifted relative to said new element is performed to determine said first position of said line segment.

10. The automatic wiring design method according to claim 8, wherein said first element is an immovable element.

11. The automatic wiring design method according to claim 8, wherein, in said determining step, in case that a second space between a second element including said line segment and a third element is smaller than a second distance by shifting said line segment to said first position, a second position of said third element to be shifted is determined so that said second space satisfies said second distance.

12. The automatic wiring design method according to claim 11, further comprising:

comparing a level of change in the complexity of a wiring pattern before and after shifting of said line segment and said third element with a predetermined reference level, wherein, in case that said level of change is equal to or less than said predetermined reference level, said complexity determining unit validates the designation of said line segment, and in case that said level of change is greater than said predetermined reference level, said complexity determining unit invalidates the designation of said line segment.

13. The automatic wiring design method according to claim 8, further comprising the step of:

comparing a level of change in the complexity of a wiring pattern before and after shifting of said line segment with a predetermined reference level, wherein, in case that said level of change is equal to or less than said predetermined reference level, said complexity determining unit validates the designation of said line segment, and in case that said level of change is greater than said predetermined reference level, said complexity determining unit invalidates the designation of said line segment.

14. The automatic wiring design method according to claim 13, wherein said complexity of said wiring pattern is determined by the total number of bends in the line segments which constitute said wiring pattern, and/or by the lengths of the line segments.

* * * * *